(12) United States Patent
Yamazaki et al.

(10) Patent No.: US 8,545,663 B2
(45) Date of Patent: Oct. 1, 2013

(54) PROCESS FOR MANUFACTURING SEMICONDUCTOR DEVICES

(75) Inventors: Osamu Yamazaki, Tokyo (JP); Isao Ichikawa, Tokyo (JP); Naoya Saiki, Tokyo (JP)

(73) Assignee: Lintec Corporation, Tokyo (JP)

( * ) Notice: Subject to any disclaimer, the term of this patent is extended or adjusted under 35 U.S.C. 154(b) by 628 days.

(21) Appl. No.: 11/835,606

(22) Filed: Aug. 8, 2007

(65) Prior Publication Data

US 2008/0066856 A1 Mar. 20, 2008

(30) Foreign Application Priority Data

Sep. 15, 2006 (JP) .................................. 2006-251131

(51) Int. Cl.
*B29C 65/00* (2006.01)
*C09J 5/02* (2006.01)
*B32B 37/00* (2006.01)
*C08J 5/00* (2006.01)
*H01L 21/00* (2006.01)

(52) U.S. Cl.
USPC ..................... 156/285; 156/307.3; 156/307.7; 257/E21.499; 438/118

(58) Field of Classification Search
USPC .................. 156/60, 278, 280, 285, 286, 288, 156/295, 297, 299, 300, 303, 305, 307.1, 156/307.3, 307.7, 311, 312, 358, 381, 382, 156/390, 580, 583.1; 257/E21.001, E21.002, 257/E21.499, E21.505, E21.514, E21.519; 438/15, 106, 118, 119
See application file for complete search history.

(56) References Cited

U.S. PATENT DOCUMENTS

| 5,853,651 | A | * | 12/1998 | Lindsay et al. ............... 264/512 |
| 6,158,115 | A | * | 12/2000 | Tsukagoshi et al. ........... 29/832 |
| 6,215,194 | B1 | | 4/2001 | Nakabayashi |
| 6,461,938 | B2 | | 10/2002 | Nakabayashi |
| 6,479,757 | B1 | | 11/2002 | Tsukagoshi et al. |
| 6,559,523 | B2 | * | 5/2003 | Schmid et al. ................. 257/673 |
| 7,906,370 | B2 | | 3/2011 | Morita |
| 2001/0001078 | A1 | | 5/2001 | Nakabayashi |
| 2001/0015010 | A1 | | 8/2001 | Tsukamoto |

(Continued)

FOREIGN PATENT DOCUMENTS

| EP | 1936675 A2 | 6/2008 |
| EP | 1936676 A2 | 6/2008 |

(Continued)

OTHER PUBLICATIONS

Product Data Sheet for Ableflex 6200. Henkel AG & Co. Jul. 2010. https://tds.us.henkel.com//NA/UT/HNAUTTDS.nsf/web/0239F72 CDDC43D26852575150047D2B7/$File/ABLEFLEX%206200-EN.pdf.*

*Primary Examiner* — Philip Tucker
*Assistant Examiner* — Brian R Slawski
(74) *Attorney, Agent, or Firm* — The Webb Law Firm

(57) ABSTRACT

In a process for manufacturing a semiconductor device comprising heating a wiring board on which a chip and an uncured adhesive layer are laminated for curing the adhesive layer, the improvement includes performing a statically pressurizing step before the adhesive layer is cured, in which step the wiring board on which the chip and the uncured adhesive layer are laminated is subjected to a static pressure greater than atmospheric pressure by not less than 0.05 MPa. According to the process, voids are easily eliminated irrespective of the design of the wiring board, and the adhesive is prevented from curling up on the chip.

4 Claims, 2 Drawing Sheets

(56) References Cited

U.S. PATENT DOCUMENTS

| | | |
|---|---|---|
| 2002/0031866 A1* | 3/2002 | Jiang .............................. 438/125 |
| 2002/0055238 A1* | 5/2002 | Sugino et al. ................... 438/459 |
| 2003/0027371 A1* | 2/2003 | Sunagawa et al. ............. 438/106 |
| 2004/0238115 A1* | 12/2004 | Matsuno et al. ............... 156/297 |
| 2005/0208700 A1* | 9/2005 | Kwon et al. .................... 438/106 |
| 2006/0113356 A1* | 6/2006 | Matsumura et al. ........... 228/101 |
| 2006/0252234 A1 | 11/2006 | Saiki |
| 2008/0211143 A1 | 9/2008 | Morita |

FOREIGN PATENT DOCUMENTS

| | | | |
|---|---|---|---|
| JP | 3053839 U | | 5/1991 |
| JP | 3169029 A | | 7/1991 |
| JP | 10050930 A | | 2/1998 |
| JP | 2001230528 A | | 8/2001 |
| JP | 2002359264 A | | 12/2002 |
| JP | 2003077953 A | * | 3/2003 |
| JP | 2003077953 A | * | 3/2003 |
| JP | 2004031975 A | | 1/2004 |
| JP | 2004311709 A | * | 11/2004 |
| WO | 2005004216 A1 | | 1/2005 |

* cited by examiner

PRIOR ART

PROCESS FOR MANUFACTURING SEMICONDUCTOR DEVICES

TECHNICAL FIELD

The present invention relates to a process for manufacturing semiconductor devices. More particularly, the invention relates to a process for manufacturing semiconductor devices by heating a wiring board on which chips are mounted via an uncured adhesive layer to cure the adhesive layer.

BACKGROUND OF THE INVENTION

In conventional production of semiconductor devices, chips are die-bonded to a wiring board with a liquid thermosetting adhesive or a film thermosetting adhesive (die-bonding step), then wires are bonded (wire-bonding step), and the chips are encapsulated (encapsulating step) (FIG. 4, V to VII). When a chip 2 is mounted on a wiring board 4 via an uncured adhesive layer 3, voids 5 are often formed in the adhesive, or voids 6 may be produced in an interface between the adhesive and the chip or the wiring board (FIG. 4). Such voids do not disappear and remain after the die-bonding step (FIG. 4). In particular, the use of a liquid adhesive frequently results in voids in the adhesive, and the use of a film adhesive often results in voids in the interface due to insufficient adhesion and insufficient followability to unevenness of an adherend surface.

These voids can be an origin of package cracks in reliability evaluation of semiconductor devices, and therefore should be eliminated.

To address this problem, Patent Document 1 improves the followability to unevenness of a wiring board by reducing the viscosity of a liquid adhesive applied, or by reducing the elastic modulus of a film adhesive used in the die-bonding or optimizing die-bonding conditions.
Patent Document 1: WO 05/004216

DISCLOSURE OF THE INVENTION

Problems to be Solved by the Invention

Although the above method can decrease voids in liquid adhesives or films adhesive, reducing the viscosity or the elastic modulus is accompanied by a problem that the adhesive squeezes out to edges of a die-bonded chip. Because chips are getting thinner in recent years, the adhesive that has squeezed out curls up onto the circuit surface of the chip to contaminate wire pads and reduce the bond strength of wires.

Particularly in the use of film adhesives, designs of wiring boards are also a factor that affects voids forming in the interfaces. With each change of designs of wiring boards, compositions of the adhesives have to be changed to control the viscosity or the elastic modulus, or die-bonding conditions have to be reviewed or optimized. Further, the film adhesives are difficult to handle. Because recent high-density wiring boards have great unevenness, it is considerably difficult to perform die-bonding while the unevenness is completely buried without causing voids.

It is an object of the invention to provide a process whereby semiconductor devices are easily manufactured without causing voids and, additionally, to provide a process whereby semiconductor devices are manufactured without causing voids and curling of an adhesive irrespective of the design of a wiring board.

Means for Solving the Problems

The present inventors have diligently studied and have found that the above problems are solved by performing a specific statically pressurizing step. The present invention has been completed based on the finding.

In a process for manufacturing a semiconductor device comprising heating a wiring board on which a chip and an uncured adhesive layer are laminated (the chip is mounted via the uncured adhesive layer) for curing the adhesive layer, the improvement of the present invention comprises performing a statically pressurizing step before the adhesive layer is cured (the curing reaction has completed), in which step the wiring board on which the chip and the uncured adhesive layer are laminated is subjected to a static pressure greater than atmospheric pressure by not less than 0.05 MPa.

In the process for manufacturing a semiconductor device, the improvement preferably comprises performing a heat curing step in which the wiring board on which the chip and the uncured adhesive layer are laminated is heated to cure the adhesive layer while maintaining the static pressure applied in the statically pressurizing step.

Effects of the Invention

According to the process for manufacturing a semiconductor device of the present invention, a chip is mounted on a wiring board via an uncured adhesive layer under usual conditions, and voids are easily eliminated in the subsequent statically pressurizing step irrespective of the design of the wiring board. Because the pressure applied to the wiring board in the statically pressurizing step is static, the adhesive does not curl up.

DETAILED DESCRIPTION OF THE INVENTION

The present invention will be described below.

Figure 1:
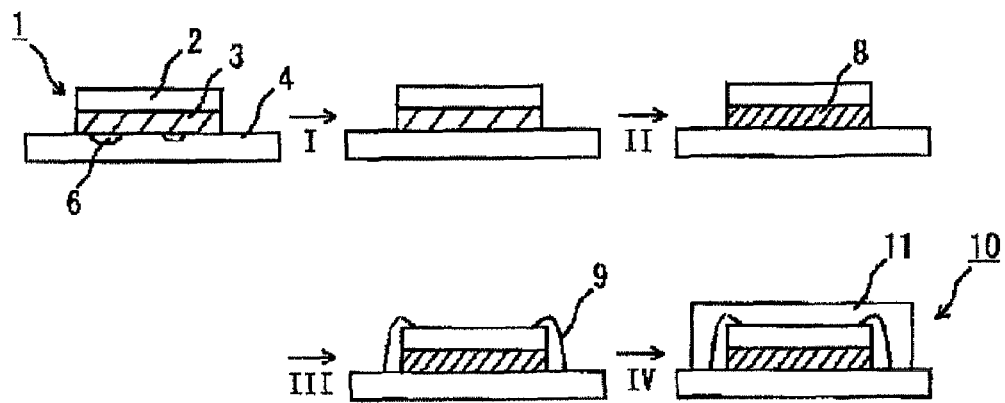
FIG. 1 is a drawing showing a process for manufacturing a semiconductor device according to the present invention.

In the process for manufacturing a semiconductor device according to the invention, a wiring board 1 on which a chip 2 and an uncured adhesive layer 3 are laminated (a wiring board 1 on which a chip 2 is die-bonded through an uncured adhesive layer 3, the same applies hereinafter) is heated to cure the uncured adhesive layer 3. A semiconductor device is thus manufactured (FIG. 1). In the final semiconductor device, the adhesive layer is sufficiently cured.

The chips 2 are obtained by cutting a semiconductor wafer with respect to respective circuits. Examples of the wiring boards 4 include lead frames of metals, boards of organic or inorganic materials, and laminates of metals and organic or inorganic materials. When a multi-stack semiconductor device is manufactured, a relatively lower chip is regarded as part of a wiring board.

The uncured adhesive layer 3 is a film adhesive or a liquid adhesive, and is preferably a film adhesive. The adhesive used in the invention is a thermosetting adhesive which contains a thermosetting resin. Examples of the thermosetting resins include epoxy resins, phenoxy resins, phenol resins, resorcinol resins, urea resins, melamine resins, furane resins, unsaturated polyester resins and silicone resins. The thermosetting resin is used in combination with an appropriate curing agent and an optional curing accelerator. Conventional thermosetting resins may be used in the invention without limitation. The thermosetting adhesive may be a sticky adhesive that shows stickiness at ordinary temperature. The sticky adhesive used herein is an adhesive that shows stickiness at ordinary temperature in an initial state and shows strong adhesion when cured by a trigger such as heat. Examples of the sticky adhesives include mixtures of binder resins showing pressure sensitive adhesion at ordinary temperature and the above-mentioned thermosetting resins. Examples of the binder resins showing pressure sensitive adhesion at ordinary temperature include acrylic resins, polyester resins, polyvinyl ether resins, urethane resins and polyamide resins.

When the adhesive layer 3 is a film adhesive, a dicing/die-bonding sheet having a film adhesive layer may be used. The dicing/die-bonding sheet includes a base film and a film adhesive layer of the above composition that is releasably laminated on the base film. The releasability of the film adhesive layer from the base film may be preferably controlled by incorporating an energy ray curable resin such as a urethane acrylate oligomer in the adhesive of the film adhesive layer. The adhesive containing the energy ray curable resin shows high adhesion to the base film before energy ray irradiation and is easily released from the base film after the energy ray irradiation.

The thickness of the film adhesive layer in the dicing/die-bonding sheet is variable depending on the level and shape of unevenness of a wiring board that is an adherend. The thickness is generally in the range of 3 to 100 μm, preferably 10 to 50 μm.

When the adhesive layer 3 is a liquid adhesive, the adhesive may be a liquid (paste) adhesive of the same composition as that of the above-mentioned film adhesive layer except for the binder resin. That is, the liquid (paste) adhesive may comprise the thermosetting resin and the curing agent.

The process of the present invention will be described with reference to an embodiment using a dicing/die-bonding sheet (film adhesive).

In an embodiment using a dicing/die-bonding sheet, the process for manufacturing a semiconductor device includes (1) a dicing step (1), a die-bonding step (2), a statically pressurizing step (3), a heat curing step (4), and an assembling step (5).

In the dicing step (1), a dicing/die-bonding sheet is applied to a wafer such as silicon, and the wafer and an uncured adhesive layer are diced. The resultant chips have the uncured adhesive layer on one surface. When the dicing/die-bonding sheet has energy ray curability, an energy ray may be applied before or after the dicing step to reduce the adhesion to a base film. Depending on conditions under which the dicing/die-bonding sheet is applied, voids may form in the interface between the chip and the uncured adhesive layer.

In the die-bonding step (2), the chips are released (picked up) from the base film at the interface between the base film and the uncured adhesive layer 3, and the chips having the uncured adhesive layer are mounted (die-bonded) on chip-mounting parts of a wiring board. Consequently, a wiring board 1 is obtained on which the chips 2 are mounted through the uncured adhesive layer 3. Depending on die-bonding conditions (such as pressure, temperature and time), voids 6 may form in the interface between the uncured adhesive layer 3 and the wiring board 4 (FIG. 1).

In the statically pressurizing step (3), a pressure (static pressure) is uniformly applied in all directions to the wiring board on which the chips are die-bonded, before the uncured adhesive layer is sufficiently cured (FIG. 1, I). In the invention, the pressure is greater than atmospheric pressure by not less than 0.05 MPa, preferably by 0.1 to 1.0 MPa. That is, the pressure applied in the invention surpasses atmospheric pressure by not less than 0.05 MPa, preferably by 0.1 to 1.0 MPa.

According to an embodiment, the statically pressurizing step is performed as follows. The wiring board 1 on which the chips 2 are die-bonded through the uncured adhesive layer 3 is subjected to the static pressure (FIG. 1, I). The application of the static pressure removes voids (not shown) between the adhesive layer 3 and the chip 2 or voids 6 between the adhesive layer 3 and the wiring board 4. Even when the wiring board 4 has a fine circuit design with great unevenness, the voids 6 that have occurred in the interface between the adhesive layer 3 and the wiring board 4 are eliminated by the statically pressurizing step. According to the invention, the voids 6 are easily removed without controlling conditions under which the chips 2 are mounted on the wiring board 4 through the uncured adhesive layer 3. The static pressure applied in the statically pressurizing step pressurizes the laminate uniformly in all directions and prevents the adhesive from squeezing out and curling up.

The pressure in the range as described above can efficiently eliminate the voids and can be applied by general-purpose pressurizing apparatuses and pressure-resistant explosion-proof equipment, enabling a compact production line. The pressure in the above range is also advantageous in that it can be reached immediately.

The pressurizing time is preferably in the range of 1 to 120 minutes, more preferably 5 to 90 minutes.

The statically pressurizing apparatus used in the invention is not particularly limited as long as it can apply a static pressure to the wiring board 1 on which the chips are die-bonded. Preferred examples of the pressurizing apparatuses include autoclaves (pressure tight cases with a compressor). Increasing the pressure in an autoclave having a fixed volume results in an elevated temperature of the atmosphere. Because the temperature is preferably constant for stable production of semiconductor devices, the temperature may be controlled while avoiding the curing of the adhesive layer 3. At controlled high temperatures, the adhesive layer is fluidized to permit the voids to move easily, and the voids may be eliminated easily. The temperature may be controlled appropriately depending on the composition of the adhesive of the adhesive layer 3, and is for example in the range of about 30 to 120° C.

In the heat curing step (4), the uncured adhesive layer 3 of the wiring board 1 is sufficiently cured by heating (FIG. 1, II). As used herein, the term "uncured" means that curing reaction has not proceeded in the adhesive, and the term "sufficiently cured" means that the curing reaction has completed and the adhesive is not deformed. The wiring board 1 from which the voids are eliminated in the statically pressurizing step (3) is removed from the pressurizing apparatus and is introduced into a heating apparatus in which the pressure is atmospheric. The uncured adhesive layer 3 is cured to give a cured adhesive layer 8, which shows bonding performance required as a die-bonding adhesive in the semiconductor device. This wiring board maintains a state created in the statically pressurizing step (3). That is, no voids are in the interfaces on both sides of the adhesive layer 8, and the chips 2 and the wiring board 4 are firmly bonded.

The heating temperature and time are not particularly limited as long as the adhesive layer is sufficiently cured. These conditions are dependent on the composition of the adhesive. The heating temperature is preferably in the range of 100 to 200° C., more preferably 120 to 160° C., and the heating time is preferably in the range of 15 to 300 minutes, more preferably 30 to 180 minutes.

The heating apparatus for the heat curing is not particularly limited, and may be a conventional heat curing apparatus (such as an oven).

In the assembling step (5), the chips of the wiring board having the cured adhesive layer are assembled into semiconductor devices. For example, referring to FIG. 1, wires 9 are connected (wire-bonding step) and the chips are encapsulated with an encapsulating resin 11 (encapsulating step) (FIG. 1, III and IV). Semiconductor devices 10 are thus manufactured. The semiconductor devices 10 obtained by the process of the invention have no voids in the interfaces of the adhesive layer and are not cracked in reliability evaluation.

In the above-described embodiment, the heat curing step (4) is performed at atmospheric pressure after the statically pressurizing step (3). It is also within the scope of the invention to cure the uncured adhesive layer 3 by heating at static pressure in the statically pressurizing step (3).

Specifically, in such an embodiment, the statically pressurizing step is performed to eliminate the voids and the heat curing step is simultaneously carried out at the static pressure to sufficiently cure the adhesive layer 3, and the statically pressurizing step and the heat curing step are terminated at the same time. In this embodiment, the heat curing at a high temperature may cause voids in the adhesive layer, but such voids are eliminated by the static pressure immediately after they are formed. In the final semiconductor devices, no voids are within and on the boundaries of the adhesive layer, and the adhesive layer is sufficiently cured and firmly bonds the chip and the wiring board.

In this embodiment, the pressure is greater than atmospheric pressure by not less than 0.05 MPa, preferably by 0.1 to 1.0 MPa. The heating temperature is not particularly limited as long as the adhesive layer is sufficiently cured, and is preferably in the range of 100 to 200° C., more preferably 120 to 160° C.

The pressurizing time and the heating time are not particularly limited as long as the voids are eliminated and the adhesive layer is sufficiently cured, and are preferably in the range of 15 to 300 minutes, more preferably 30 to 180 minutes.

According to an embodiment of the invention, the heat curing step may be performed in two stages in which the first stage is carried out under heating conditions such that the adhesive layer is not cured, and the second stage is carried out under heating conditions such that the adhesive layer is cured. The heating conditions in the first stage may be such that the heating temperature is about 30 to 120° C. and the heating time is preferably 1 to 120 minutes, more preferably 5 to 90 minutes. The heating conditions in the second stage may be such that the heating temperature is 120 to 200° C. and the heating time is preferably 15 to 300 minutes, more preferably 30 to 180 minutes.

Figure 4:
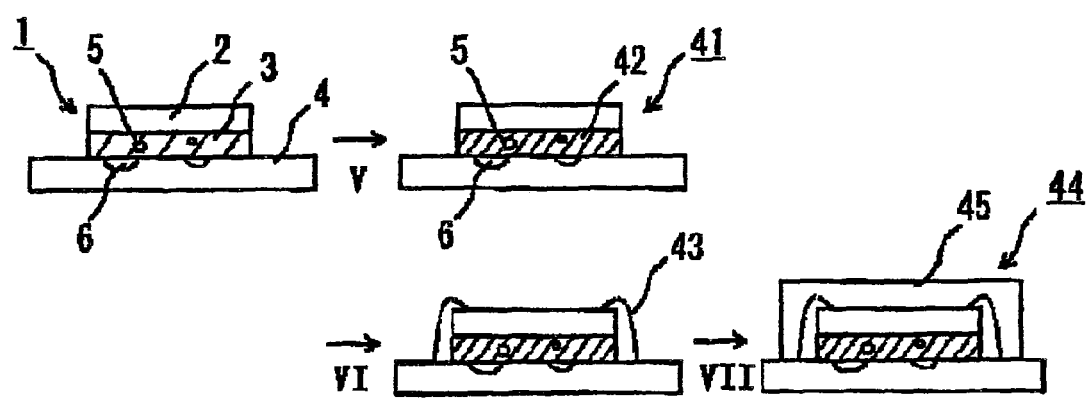
FIG. 4 is a drawing showing a conventional process for manufacturing a semiconductor device.

In the process for manufacturing semiconductor devices of the present invention, the adhesive layer 3 may be formed of a liquid (paste) adhesive. When a liquid adhesive is used, chips are prepared by cutting a wafer in the dicing step (1) using a general dicing sheet without a die-bonding function, instead of the dicing/die-bonding sheet. In the die-bonding step (2), the chips are picked up and are die-bonded to a wiring board coated with a liquid adhesive. The statically pressurizing step (3), the heat curing step (4) and the assembling step (5) may be performed as described hereinabove. To improve handling properties of the wiring board on which the chips are die-bonded, the liquid adhesive may be semi-cured (B-staged) by heating before the statically pressurizing step (3). Even if voids 5 form in the liquid adhesive layer 3 in the die-bonding step, they are eliminated in the statically pressurizing step (FIG. 4).

Configurations of the semiconductor devices manufactured by the process of the invention are not limited to the aforesaid embodiments, and the process of the invention may be applied to production of semiconductor devices having various structures.

Figure 2:
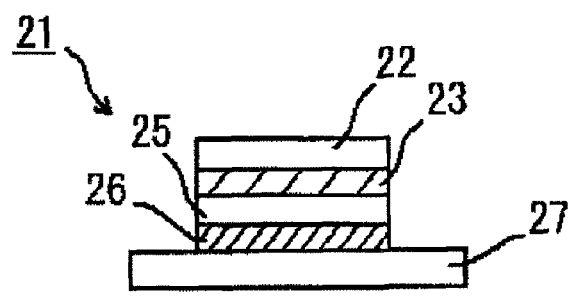
FIG. 2 shows an example of a wiring board used in the present invention in which chips and an uncured adhesive layer are laminated.

For example, the process of the invention may be applied to production of multi-stack semiconductor devices. Specifically, the process may be used for die-bonding a relatively upper chip 22 and a relatively lower chip 25 (wiring board) to which wires may be connected, through an uncured adhesive layer 23 (FIG. 2). Obtainable semiconductor devices may be same-size stack semiconductor devices in which the upper and lower chips have a same size as shown in FIG. 2, or may be pyramid multi-stack semiconductor devices in which the chips are of different sizes. The same-size stack semiconductor devices may be such that connected wires are buried in the adhesive layer 23, in which case the present invention is advantageous because voids around the wires are eliminated.

The multi-stack semiconductor devices may be manufactured according to the aforesaid embodiments except that the lower chip 25 is used as a substitute for the wiring board 1.

Figure 3:
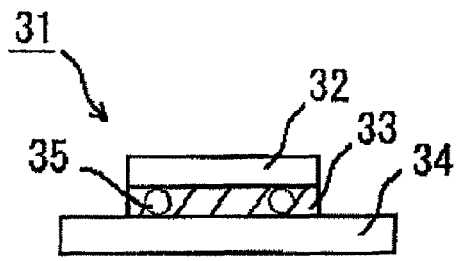
FIG. 3 shows an example of a wiring board used in the present invention in which a chip and an uncured adhesive layer are laminated.

The process of the invention may be used for manufacturing flip chip semiconductor devices as shown in FIG. 3. In this case, an underfill material used in the flip chip bonding corresponds to the uncured adhesive layer. The underfill material may be a liquid (paste) or a sheet. A heat curable underfill sheet described in Japanese Patent Application No. 2005-129502 by the present applicant et al. may be used.

The following is an embodiment of the process using an underfill sheet. A semiconductor wafer is prepared in which bumps are formed on a circuit surface. An underfill layer (adhesive layer 33) of an underfill sheet is attached to the circuit surface of the semiconductor wafer such that the bumps penetrate the underfill layer. A general dicing tape is attached to the back surface of the semiconductor wafer, and the wafer is fixed to a ring frame via the dicing tape. The semiconductor wafer is cut into chips with a dicing apparatus. The base of the underfill sheet is removed to expose the tops of the bumps. In the consequent chip, the circuit surface is covered with the uncured adhesive layer 33, and the tops of the bumps 35 are exposed from the adhesive layer 33. The chip 32 is mounted on a wiring board 34 with alignment such that the bumps 35 are opposed to electrodes of the wiring board 34 to establish electrical conduction between the chip 32 and the wiring board 34. A wiring board 31 is thus prepared in which the chips are mounted (flip chip bonded) through the uncured adhesive layer 33 (underfill material).

In this embodiment, the wiring board on which the chips are flip chip bonded is subjected to the statically pressurizing step (3), the heat curing step (4) and the assembling step (5) as described hereinabove. In this embodiment, the wire-bonding step in the assembling step (5) is not necessary. The uncured adhesive layer 33 (underfill material) is cured and the chips are encapsulated. Semiconductor devices are thus manufactured.

EXAMPLES

The present invention will be described by Examples below without limiting the scope of the invention.

Example 1

(1) Dicing Step

A dicing/die-bonding sheet (Adwill LE-5003, manufactured by LINTEC Corporation) was attached to a dummy silicon wafer (200 mm in diameter, 150 μm in thickness) with use of a tape mounter (Adwill RAD 2500 m/8, manufactured by LINTEC Corporation). The wafer was fixed to a ring frame at the same time. The dicing/die-bonding sheet was UV irradiated through a base film thereof using a UV irradiator (Adwill RAD 2000 m/8, manufactured by LINTEC Corporation). The wafer was diced into 8 mm square chips with a dicing apparatus (DFD 651, manufactured by DISCO Corporation). The cutting depth was such that the base film of the dicing/die-bonding sheet was cut to a depth of 20 μm.

(2) Die-bonding Step

A wiring board (manufactured by CHINO GIKEN Co,, Ltd.) used for die-bonding the chips was a copper-clad laminate (CCL-HL830, manufactured by MITSUBISHI GAS CHEMICAL COMPANY, INC.) in which the copper foil formed circuit patterns and a solder resist (PSR-4000 AUS5, manufactured by TAIYO INK MFG. CO., LTD.) was on the respective patterns. The silicon chips obtained in the step (1) were picked up together with the sticky adhesive layer (uncured adhesive layer) and were mounted on the wiring board via the sticky adhesive layer. The chips were compression bonded (die-bonded) at 100° C. and 300 gf for 1 second.

(3) Statically Pressurizing Step

The wiring board on which the chips were die-bonded in the step (2) was placed in a heating pressurizer (autoclave manufactured by Kurihara Manufactory Inc.). The wiring board was heated at 100° C. and a static pressure greater than atmospheric pressure by 0.5 MPa for 30 minutes. Voids in the sticky adhesive layer were thus eliminated.

(4) Heat Curing Step

The wiring board was removed from the heating pressurizer and was introduced into an oven. The wiring board was heated at 120° C. and atmospheric pressure for 1 hour, and subsequently at 140° C. and atmospheric pressure for 1 hour. The sticky adhesive layer was thus cured.

(5) Assembling Step

The chips on the wiring board obtained in the step (3) were encapsulated with an encapsulating resin (KE-1100 AS3, manufactured by KYOCERA Chemical Corporation) in an encapsulating thickness of 400 μm by use of an encapsulating apparatus (MPC-06M Trial Press, manufactured by APIC YAMADA CORPORATION). The encapsulating resin was cured at 175° C. in 5 hours. The encapsulated wiring board was attached to a dicing tape (Adwill D-510T, manufactured by LINTEC Corporation) and the encapsulated wiring board was cut into 12 mm squares with use of a dicing apparatus (DFD 651, manufactured by DISCO Corporation). Consequently, simulated wire-free semiconductor devices having the dummy chips were manufactured.

Example 2 to Example 6

Simulated semiconductor devices were manufactured in the same manner as in Example 1, except that the statically pressurizing step (3) was carried out under the conditions shown in Table 1. In Table 1, the pressure is expressed by a value by which the pressure surpassed atmospheric pressure.

TABLE 1

| | Pressure (MPa) | Temperature (° C.) | Time (minutes) |
|---|---|---|---|
| Ex. 1 | 0.5 | 100 | 30 |
| Ex. 2 | 0.1 | 100 | 30 |
| Ex. 3 | 0.9 | 100 | 30 |
| Ex. 4 | 0.5 | 50 | 30 |
| Ex. 5 | 0.5 | 100 | 10 |
| Ex. 6 | 0.5 | 100 | 60 |

Example 7

Simulated semiconductor devices were manufactured in the same manner as in Example 1, except that the statically pressurizing step (3) and the heat curing step (4) were started and completed simultaneously. Specifically, the sticky adhesive layer was sufficiently cured at a static pressure greater than atmospheric pressure by 0.5 MPa, at 120° C. for 1 hour and then at 140° C. for 1 hour.

Example 8

Simulated semiconductor devices were manufactured in the same manner as in Example 1, except that the dicing/die-bonding sheet was changed to Adwill LE-5006 (manufactured by LINTEC Corporation).

Example 9

(1) Dicing Step

A UV-curable dicing tape (Adwill D-628, manufactured by LINTEC Corporation) was attached to a dummy silicon wafer (200 mm in diameter, 150 μm in thickness) with use of a tape mounter (Adwill RAD 2500 m/8, manufactured by LINTEC Corporation). The wafer was fixed to a ring frame at the same time. The wafer was diced into 8 mm square chips with a dicing apparatus (DFD 651, manufactured by DISCO Corporation). The cutting depth was such that a base film of the dicing tape was cut to a depth of 20 μm. The dicing tape was UV irradiated through the base film thereof using a UV irradiator (Adwill PAD 2000 m/8, manufactured by LINTEC Corporation).

(2) Die-bonding Step

A wiring board (manufactured by CHINO GIKEN Co., Ltd.) used for die-bonding the chips was a copper-clad laminate (CCL-HL830, manufactured by MITSUBISHI GAS CHEMICAL COMPANY, INC.) in which the copper foil formed circuit patterns and a solder resist (PSR-4000 AUS5, manufactured by TAIYO INK MFG. CO., LTD.) was on the respective patterns. A paste adhesive of the following composition was applied to the wiring board. The silicon chips obtained in the step (1) were picked up and were placed on the paste adhesive on the respective wiring patterns. The chips were compression bonded (die-bonded) at 23° C. and 100 gf for 1 second.

(Composition of the Paste Adhesive)

30 parts by weight of a liquid bisphenol A-skeleton epoxy resin (EPIKOTE 828, manufactured by Japan Epoxy Resins Co., Ltd.)

15 parts by weight of a glycidylamine epoxy resin (EPIKOTE 630, manufactured by Japan Epoxy Resins Co., Ltd.)

5 parts by weight of a novolak epoxy resin (EOCN-102S, manufactured by NIPPON KAYAKU CO., LTD.)

5 parts by weight of a dispersion of a curing agent (ADEKA HARDENER 3636AS, manufactured by ADEKA CORPORATION) in an organic solvent (methyl ethyl ketone) (solid concentration: 15%)

10 parts by weight of a dispersion of a curing accelerator (CUREZOL 2PHZ, manufactured by SHIKOKU CHEMI- CALS CORPORATION) in an organic solvent (methyl ethyl ketone) (solid concentration: 15%)

(3) Statically Pressurizing Step and (4) Heat Curing Step

A statically pressurizing step (3) and a heat curing step (4) were started and completed simultaneously. Specifically, the wiring board on which the chips were die-bonded was placed in a heating pressurizer (autoclave manufactured by Kurihara Manufactory Inc.). The adhesive layer was cured at a static pressure greater than atmospheric pressure by 0.5 MPa, at 120° C. for 1 hour and then at 140° C. for 1 hour.

(5) Encapsulating Step

The chips on the wiring board obtained in the step (3) were encapsulated with an encapsulating resin (KE-1100 AS3, manufactured by KYOCERA Chemical Corporation) in an encapsulating thickness of 400 μm by use of an encapsulating apparatus (MPC-06M Trial Press, manufactured by APIC YAMADA CORPORATION). The encapsulating resin was cured at 175° C. in 5 hours. The encapsulated wiring board was attached to a dicing tape (Adwill D-510T, manufactured by LINTEC Corporation) and the encapsulated wiring board was cut into 12 mm squares with use of a dicing apparatus (DFD 651, manufactured by DISCO Corporation). Simulated semiconductor devices were thus manufactured.

Comparative Example 1

Simulated semiconductor devices were manufactured in the same manner as in Example 1, except that the wiring board on which chips were die-bonded was placed in the heating pressurizer but was not pressurized, and the sticky adhesive layer was cured in the pressurizer by heating at 120° C. and atmospheric pressure for 1 hour, and subsequently at 140° C. and atmospheric pressure for 1 hour. In this Comparative Example, the statically pressurizing step was not performed.

Comparative Example 2

Example 9 was reproduced except that the chips were compression bonded at 23° C. and 500 gf for 1 second in the die-bonding step (2). The die-bonding step resulted in the excessive curling up of the adhesive and the subsequent steps were cancelled.

[Evaluation Tests]

Test 1: Voids

Examples and Comparative Examples were reproduced except that the silicon wafer was replaced by a transparent glass circular plate (manufactured by NSG PRECISION Co., Ltd., 8 inch in diameter, 100 μm in thickness). The wiring board on which the glass chips were die-bonded displayed the adhesive layer through the transparent glass chips, and the board was inspected for voids with a digital microscope. The results are shown in Table 2.

Test 2: Curling Up of the Adhesive on the Chip Surface

At the completion of the statically pressurizing step (3) and the heat curing step (4) in each of Examples and Comparative Examples, the cross section of the wiring board on which the chips were die-bonded and the surface of the chips were observed with a digital microscope to determine whether the adhesive curled up on the chip surface. The results are shown in Table 2.

Test 3: Reliability of Semiconductor Packages

The semiconductor devices (semiconductor packages) obtained in the encapsulating step (5) in each of Examples and Comparative Examples were allowed to stand at 85° C. and 60% RH for 168 hours and thereby were allowed to absorb moisture. The packages were then subjected to IR reflow conditions at a maximum temperature of 260° C. for a heating time of 1 minute (reflow furnace: WL-15-20DNX, manufactured by Sagami-Rikou Co., Ltd.). These moisture absorption and heating treatments were repeated three times. The packages were cross sectionally observed with a scanning ultrasonic flaw detector (Hye-Focus, manufactured by Hitachi Kenki Fine Tech Co., Ltd.) to determine whether lifting or separation occurred in the joints of the chip and the wiring board and whether the packages were cracked. When the joints were separated by a length of 0.5 mm or more, the semiconductor packages were rejected. Twenty five semiconductor packages were tested, and the packages without such separation were counted. The results are shown in Table 2.

TABLE 2

| | Voids | | | Curling of adhesive | | | |
|---|---|---|---|---|---|---|---|
| | After step (2) | After step (3) | After step (4) | After step (2) | After step (3) | After step (4) | Package reliability |
| Ex. 1 | Present | Not present | Not present | Not present | Not present | Not present | 25/25 |
| Ex. 2 | Present | Not present | Not present | Not present | Not present | Not present | 25/25 |
| Ex. 3 | Present | Not present | Not present | Not present | Not present | Not present | 25/25 |
| Ex. 4 | Present | Not present | Not present | Not present | Not present | Not present | 25/25 |
| Ex. 5 | Present | Not present | Not present | Not present | Not present | Not present | 25/25 |
| Ex. 6 | Present | Not present | Not present | Not present | Not present | Not present | 25/25 |
| Ex. 7 | Present | Not present | | Not present | Not present | | 25/25 |
| Ex. 8 | Present | Not present | Not present | Not present | Not present | Not present | 25/25 |
| Ex. 9 | Present | Not present | | Not present | Not present | | 25/25 |
| Comp. Ex. 1 | Present | — | Present | Not present | — | Not present | 10/25 |
| Comp. Ex. 2 | Not present | — | — | Present | — | — | — |

The invention claimed is:

1. In a process for manufacturing a semiconductor device comprising heating a wiring board on which a chip and an uncured adhesive layer are laminated for curing the adhesive layer, the improvement comprising performing the following steps:

applying a dicing/die-bonding sheet to a wafer and dicing the wafer and an uncured adhesive layer in order to prepare chips;

releasing the chips from a base film of the dicing/die-bonding sheet at an interface between the base film and the uncured adhesive layer, and mounting the released chips on the wiring board;

a statically pressurizing step before the adhesive layer is cured in the following heat curing step, in which step the wiring board on which the chip and the uncured adhesive layer are laminated is subjected to a static pressure greater than atmospheric pressure by 0.05 to 1.0 MPa, in which step a temperature of an atmosphere surrounding the semiconductor device is controlled to be in the range of about 30° C. to about 120° C. while avoiding a curing of the adhesive layer, and in which step the pressure is directly and uniformly applied to the wiring board in all directions without using a bag-shaped object formed of a flexible material and a flexible sheet, the uncured adhesive layer being a single adhesive layer formed from a liquid adhesive or a single adhesive layer formed from a film adhesive; and a heat curing step comprising curing the uncured adhesive layer of the wiring board by heating the wiring board on which the chip and the uncured adhesive layer are laminated under the application of static pressure, wherein the statically pressurizing step and the heat curing step are terminated at the same time.

2. In the process for manufacturing a semiconductor device according to claim 1, the static pressure applied in the statically pressurizing step is maintained during the heat curing step in which the wiring board on which the chip and the uncured adhesive layer are laminated.

3. In a process for manufacturing a semiconductor device according to claim 1, further comprising performing the following steps (1) and (2) to provide the wiring board on which chips and an uncured adhesive layer are laminated:

(1) a dicing step comprising applying, to a wafer, a dicing/die-bonding sheet in which a film adhesive layer is provided on a base film and dicing the wafer and an uncured adhesive layer to thereby obtain chips having the uncured adhesive layer on one surface; and (2) a die-bonding step comprising releasing the chips from the base film at an interface between the base film and the uncured adhesive layer of the dicing/die-bonding sheet and mounting the chips having the uncured adhesive layer on chip-mounting parts of a wiring board to thereby obtain a wiring board on which the chips are mounted through the uncured adhesive layer.

4. In a process for manufacturing a semiconductor device comprising heating a wiring board on which a chip and an uncured adhesive layer are laminated for curing the adhesive layer, the improvement comprising performing the following steps:

applying a dicing/die-bonding sheet to a wafer and dicing the wafer and an uncured adhesive layer in order to prepare chips;

releasing the chips from a base film of the dicing/die-bonding sheet at an interface between the base film and the uncured adhesive layer, and mounting the released chips on the wiring board;

a statically pressurizing step before the adhesive layer is cured in the following heat curing step, in which step the wiring board on which the chip and the uncured adhesive layer are laminated is subjected to a static pressure greater than atmospheric pressure by 0.05 to 1.0 MPa, in which step a temperature of an atmosphere surrounding the semiconductor device is controlled to be in the range of about 30° C. to about 120° C. while avoiding a curing of the adhesive layer, wherein the static pressure is directly and uniformly applied to the wiring board in all directions and is applied by placing the wiring board in an autoclave and increasing the pressure within the autoclave, the uncured adhesive layer being a single adhesive layer formed from a liquid adhesive or a single adhesive layer formed from a film adhesive; and a heat curing step comprising curing the uncured adhesive layer of the wiring board by heating the wiring board on which the chip and the uncured adhesive layer are laminated under the application of static pressure, wherein the statically pressurizing step and the heat curing step are terminated at the same time.

\* \* \* \* \*